United States Patent [19]

Aoki

[11] Patent Number: 5,797,757

[45] Date of Patent: Aug. 25, 1998

[54] PCB MULTI-POLE CONNECTOR

[75] Inventor: Yoshihito Aoki, Shizuoka, Japan

[73] Assignee: Yazaki Corporation, Tokyo, Japan

[21] Appl. No.: 747,701

[22] Filed: Nov. 12, 1996

[30] Foreign Application Priority Data

Nov. 13, 1995 [JP] Japan .................. 7-294433

[51] Int. Cl.$^6$ .......................... H01R 4/66; H01R 13/648
[52] U.S. Cl. .................... 439/101; 439/74; 439/731
[58] Field of Search ................. 439/79, 364, 701, 439/731, 108, 101, 65, 74

[56] References Cited

U.S. PATENT DOCUMENTS

| | | | |
|---|---|---|---|
| 4,846,727 | 7/1989 | Glover et al. | 439/108 |
| 4,952,172 | 8/1990 | Barkus et al. | 439/79 |
| 4,997,386 | 3/1991 | Kawachi et al. | 439/540.1 |
| 5,037,330 | 8/1991 | Fulponi et al. | 439/79 |
| 5,079,671 | 1/1992 | Garrett et al. | 439/79 |
| 5,201,662 | 4/1993 | Roche | 439/79 |
| 5,354,219 | 10/1994 | Wanjura | 439/701 |
| 5,454,733 | 10/1995 | Watanabe et al. | 439/701 |

FOREIGN PATENT DOCUMENTS 55-165585  12/1980  Japan .
60-54184   3/1985   Japan .

OTHER PUBLICATIONS

JIII Journal of Technical Disclosure No. 94–22279: p. 1 (Dec. 15, 1994).

*Primary Examiner*—Gary F. Paumen
*Assistant Examiner*—Katrina Davis
*Attorney, Agent, or Firm*—Morgan, Lewis & Bockius LLP

[57] ABSTRACT

A PCB multi-pole connector including a connector body, a plurality of terminals mounted in the connector body, the terminals having first end portions for mating with terminals of a mating connector and second end portions for connecting with circuit patterns formed on printed circuit boards, and a bus bar card accommodating a bus bar, the bus bar card including upper and lower cases having cut portions, the bus bar including a terminal portion and a connecting portion having a cut portion, in which the bus bar card is detachably mounted in the connector body to juxtapose the terminal portion with the first end portions of the terminals, the connecting portion of the bus bar is electrically connected to at least one of the circuit patterns of the printed circuit boards with an auxiliary member.

15 Claims, 5 Drawing Sheets

PCB MULTI-POLE CONNECTOR

BACKGROUND OF THE INVENTION

FIELD OF THE INVENTION

This invention relates to a printed circuit board multi-pole connector in which printed circuit boards (hereinafter referred to as "PCBs", when applicable) are connected in multiple layers.

BACKGROUND

A variety of electronic devices including central processing units (CPUs) are installed on today's automobiles. PCBs are employed with various circuits in such electronic devices. PCBs and conductors, such as wire harnesses, are detachably connected to one another through connectors in order to enhance the efficiency in assembling work or maintenance thereof.

FIGS. 7 and 8 show a conventional PCB multi-pole connector. The conventional PCB multi-pole connector 51 includes a box-shaped connector housing 51 formed by molding, and a number of connecting terminals 53 which are fixedly held by the connector housing 51 such that the terminals are arranged in two lines, and divided into two groups (first and second groups). The connector housing 52 has a recess on its one side which serves as an engaging section 54 for a mating connector 61 (described later). The engaging section 54 has a stand-shaped fixing protrusion 55 substantially at the center. A nut 56 is buried in the fixing protrusion 55 substantially at the center, to which the mating connector 61 is secured with a screw.

The connecting terminals 53 are each L-shaped. More specifically, first end portions of the connecting terminals 53, which are located inside the engaging section 54, are each fork-shaped (U-shaped). The second end portions of the connecting terminals 53 are extended through the main wall of the connector housing 52, and are bent in the opposite direction to the first end portions the connecting terminals are then soldered to circuit patterns (not shown) formed on PCBs 55a and 55b, respectively.

As shown in FIG. 8, fixing members 58a and 58b are formed on side walls of the connector housing 51, and the PCBs 55a and 55b are secured to the fixing members 58a and 58b with screws; that is, two PCBs 55a and 55b are fixedly provided on both sides of the connector housing 51. The aforementioned second end portions of the connecting terminals 53 of the first and second groups are inserted into the circuit patterns formed on the PCBs 55a and 55b, respectively, and soldered to the circuit patterns.

The mating connector 61 is a male connector, and its connector housing 62 is so shaped as to be engageable with the engaging section 54 of the connector housing 52. Female connecting terminals are buried in the connector housing 62. Wires are connected to the female connecting terminals, and led out through lead-out holes 62 formed in the connector housing 52.

The mating connector 61 is connected to the multi-pole connector 51 as follows. First, the mating connector 61 is pushed into the engaging section 54 of the connector housing 52 in the direction of the arrow A (FIG. 7). As a result, the female connecting terminals of the mating connector 61 are electrically connected to the male connecting terminals, while a screw through-hole 63 formed in the mating connector is confronted with the nut buried in the fixing protrusion 55. Under this condition, a screw 64 is inserted into the screw through-hole 63 and fixedly screwed into the nut 56. As a result, the multi-pole connector 51 and the mating connector 61 are positively and fixedly engaged with each other.

Circuit patterns, which are formed on the PCBs 55a and 55b, may be those in which small current flows. However, they also may be required to form circuit patterns such as those for power lines and ground (GND) lines in which large current flows. A circuit pattern for large current must be large in width because of its current capacity.

However, in the above-described multi-pole connector 51, the second end portions of adjacent ones of the connecting terminals 53 are close to one another, and therefore the parts of the circuit pattern which are to be connected to the connecting terminals 53 cannot be increased in width. Hence, the width of the circuit pattern regulates the current capacity, thus lowering the degree of freedom in designing an aimed circuit.

In order to solve the above-described problem, a method has been proposed in which circuit patterns are formed large in width with respect to a given current capacity, and a plurality of connecting terminals 53 are connected to the circuit patterns large in width. However, the method gives rise to another problem. That is, since a plurality of connecting terminals 53 are used for one circuit connection, the number of connecting terminals are not large enough, so that the number of connecting terminals to be used for other circuit functions such as transmission and reception of control signals, are in short supply.

In addition, another method has been proposed for circuit patterns large in width that are formed near the connecting terminals 53, and are then connected through jumper wires to circuit patterns small in width, which in turn are connected to the connecting terminals 53. However, the method is also disadvantageous in that its wiring work takes excessive time and labor, and it is necessary to prepare wire materials having predetermined dimensions, which is undesirable in production control.

In the conventional PCB multi-pole connector, as was described above, the multi-pole connector 51, and two PCBs 55a and 55b are provided as one unit, being in the form of a sandwich structure. Moreover, circuits patterns on the two PCBs 55a and 55b sometimes must be connected to each other. In this case, heretofore wire materials are used, or the mating connector 61 is engaged with the multi-pole connector 51, to connect the aimed circuit patterns to each other. However, the method, similarly as in the above-described methods, is disadvantageous in that the number of components is large, and some of the connecting terminals become useless.

SUMMARY OF THE INVENTION

In view of the foregoing, an object of the present invention is to provide a PCB multi-pole connector in which circuit patterns large in current capacity are formed, which is easy to assemble, work of PCBs, and is improved in the degree of which has improved degree of reliability, which is easily interchangeable. The foregoing objects of the invention have been achieved by the provision of a PCB multi-pole connector in which printed circuit boards are fixedly secured to a connector body, and connecting circuits are formed between terminals held by the connector body and circuit patterns formed on the printed circuit boards. A bus bar card accommodating bus bars is detachably engaged with the connector body, upon engagement of the bus bar card with the connector body, connecting circuits are formed between a mating connector engaged with the connector body and circuit patterns formed on any one of the printed circuit boards, and between circuit patterns are formed on the printed circuit boards.

In the PCB multi-pole connector, the bus bar card includes upper and lower cases which have cut portions, where first end portions of the bus bars are longitudinally exposed.

Furthermore, in the PCB multi-pole connector, a circuit pattern for a large current which is formed in any one of the printed circuit boards is electrically connected to any one of the bus bars accommodated in the bus bar card.

Moreover, in the PCB multi-pole connector, the printed circuit boards are secured to both side surfaces of the connector body in such a manner that the printed circuit boards are confronted with each other, and the bus bar card is detachably set between the printed circuit boards.

With the PCB multi-pole connector of the invention, when necessary the bus bar card accommodating the bus bars can be coupled to the connector body, and the mating connector is connected to the bus bars built in the bus bar card, while the bus bars exposed in the cut portions formed in the bus bar cards are connected to the circuit patterns of the PCBs, thus forming a circuit for a large current. In addition, through the exposed parts of the bus bars, the circuit patterns formed on the PCBs can be connected to each other.

DETAILED DESCRIPTION OF THE PREFERRED EMBODIMENTS

A PCB multi-pole connector of a preferred embodiment of the invention will be described with reference to FIGS. 1 through 6.

Figure 1:
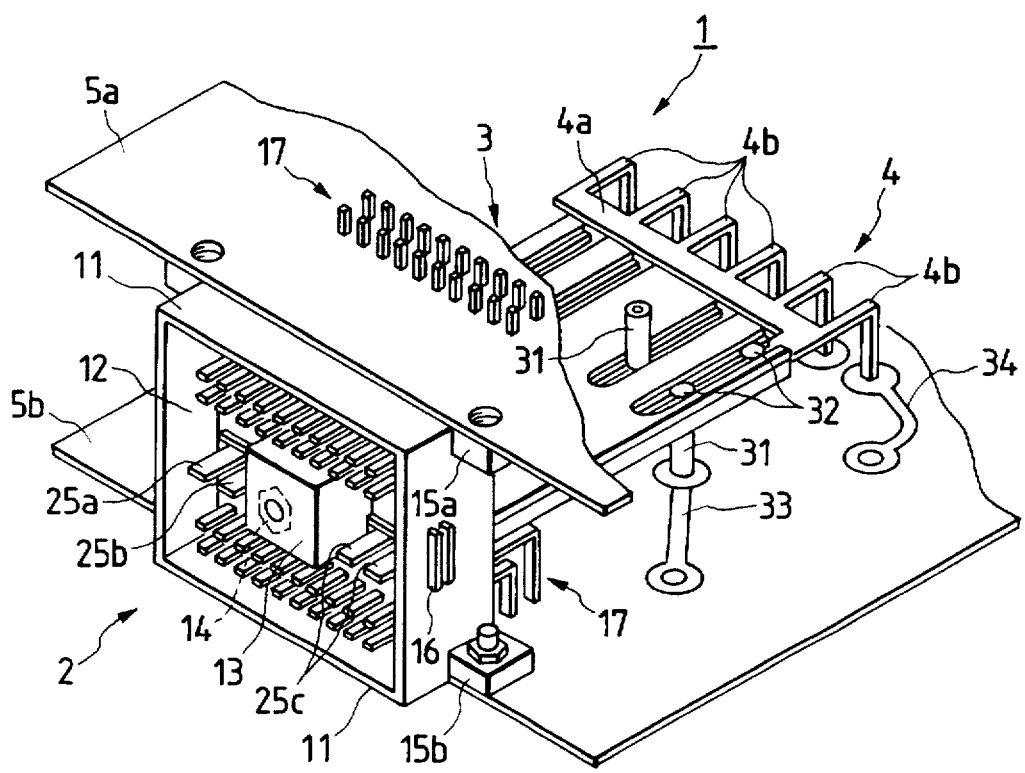
FIG. 1 is a perspective view of a PCB multi-pole connector, which constitutes a preferred embodiment of the invention.
Figure 7:
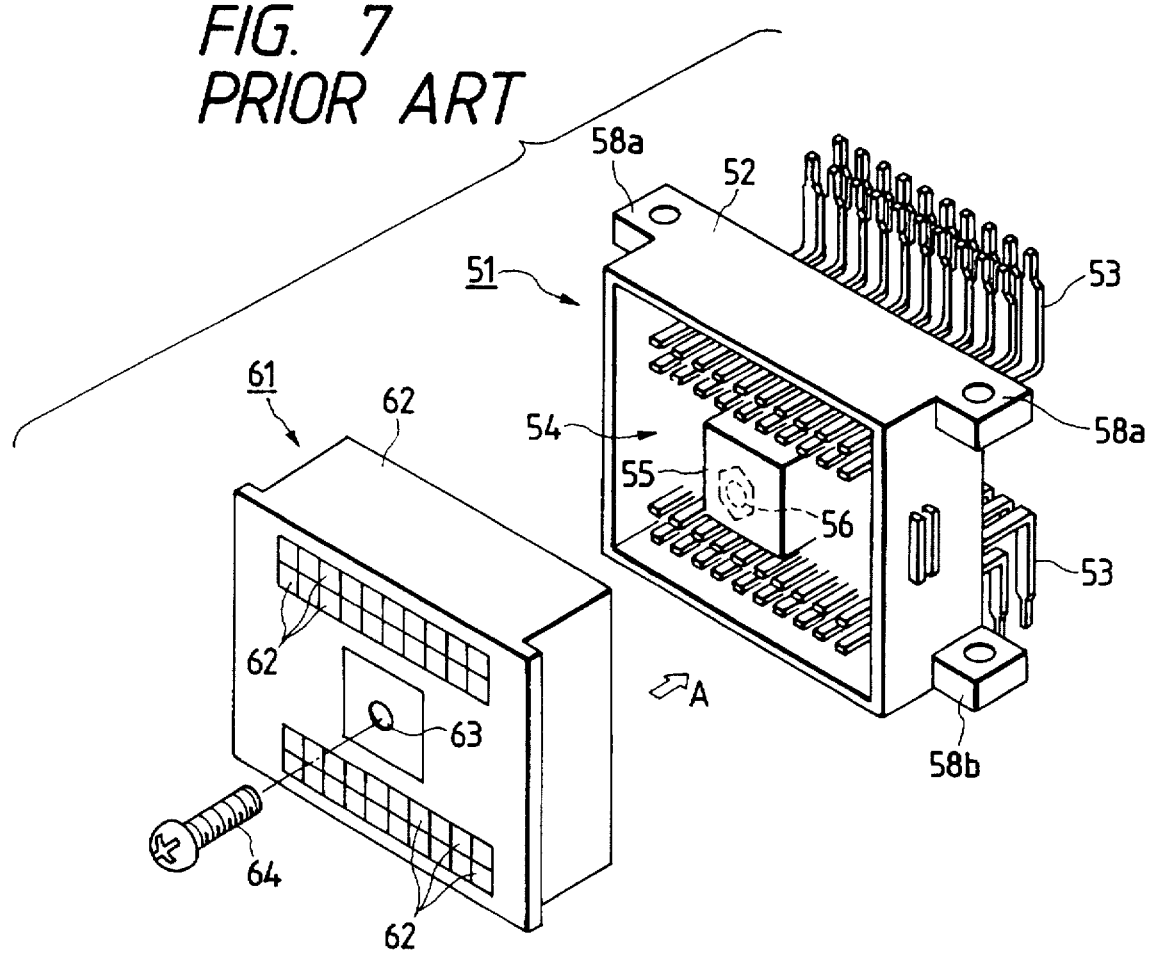
FIG. 7 is a perspective view showing an example of a conventional PCB multi-pole connector.
Figure 8:
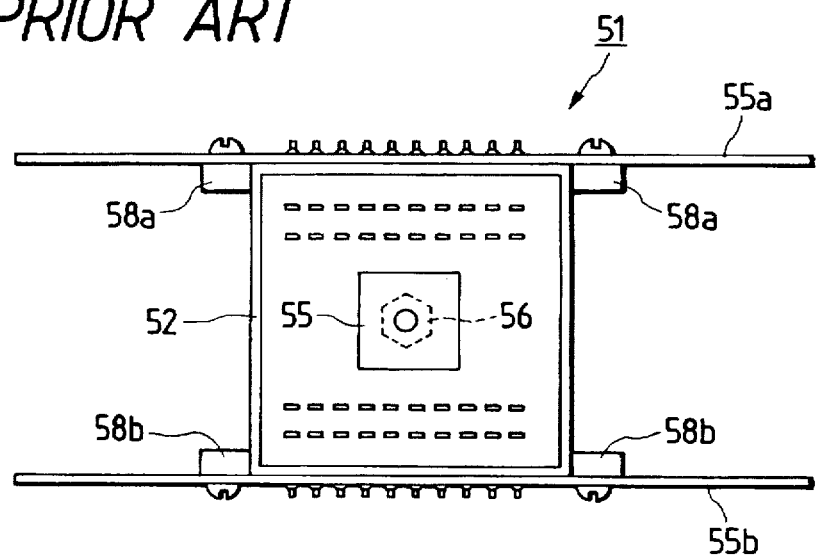
FIG. 8 is a side view for a description of the structure of the conventional PCB multi-pole connector.

As shown in FIG. 1, the PCB multi-pole connector 1 of the invention (hereinafter referred to merely as "a connector 1", when applicable) includes a connector body 2, a bus bar card, and a bus bar 4. In the connector 1, two PCBs 5a and 5b are mounted on two opposite walls of a rectangular-box-shaped housing 11 forming the connector body 2 in such a manner that they are confronted with each other and are electrically connected. With the bus bar card 3 mounted, a mating connector is electrically connected through the bus bar card 3 to the two PCBs 5a and 5b, the bus bar 4, and circuit patterns 33 formed on the two PCBs 5a and 5b. The mating connector is, for instance, the male connector 61 which has been described with respect to the conventional art (cf. FIGS. 7 and 8).

Figure 2:
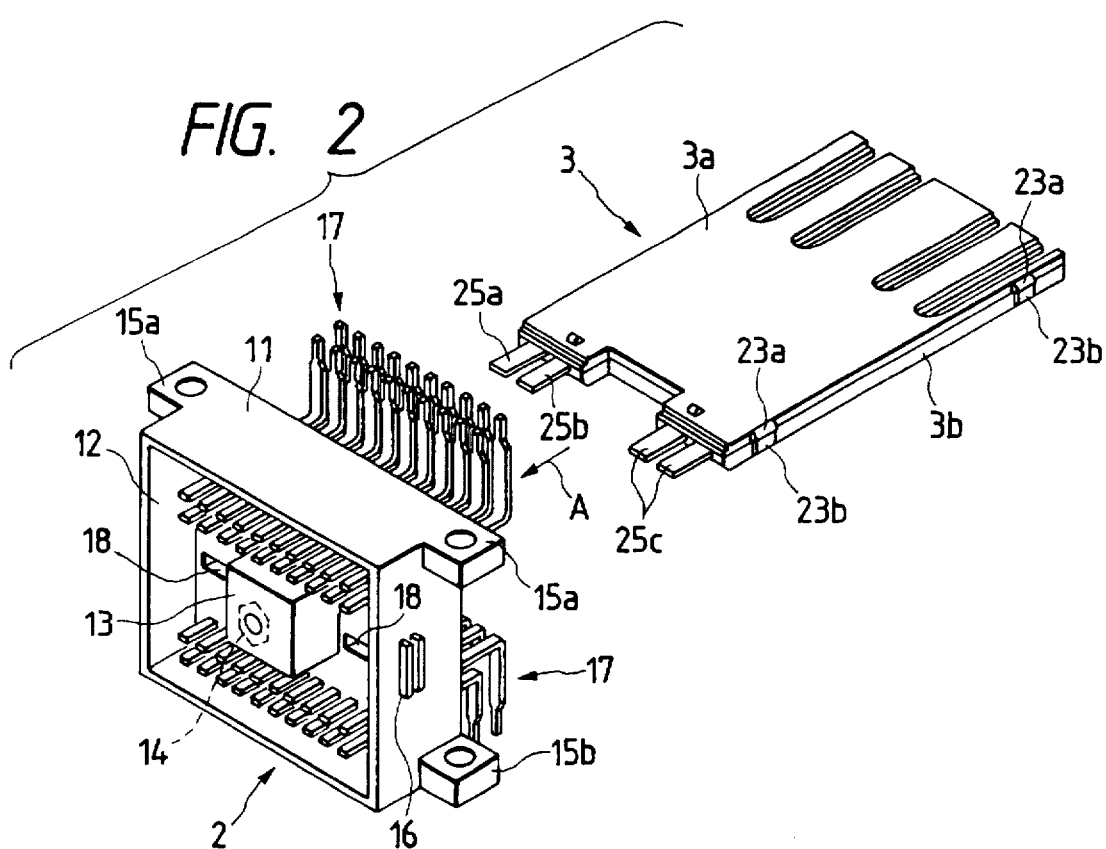
FIG. 2 is an exploded perspective view of the PCB multi-pole connector shown in FIG. 1.

As shown in FIG. 2, the housing 11 of the connector body 2, which is a female connector, has a recess 12 on one side which is engaged with the mating connector, which is a male connector. The recess 12 of the housing 11 has a fixing protrusion 13 substantially at the center. A nut 14 is buried in the fixing protrusion 13 to fixedly secure the mating connector to the latter with a screw. The housing 11 has fixing members 15a and 15b on its side walls to fixedly secure the PCBs 5a and 5b (described later), and locking pieces 16 to lock the housing, for instance, to a panel (not shown).

In addition, a number of L-shaped connecting terminals 17 are fixedly held by the housing 11 in such a manner that they are arranged in two lines while being divided into two groups (first and second groups) which are confronted with each other. First end portions of the L-shaped connecting terminals 17 are extended in the recess 12 of the housing 11 so as to be engaged with the connecting terminals of the mating connector. In addition, inserting holes 18, into which the bus bar card 3 is inserted are formed in the bottom of the recess 12, more specifically, they are located between the two groups of connecting terminals 17 and on both sides of the fixing protrusions 13.

Figure 4:
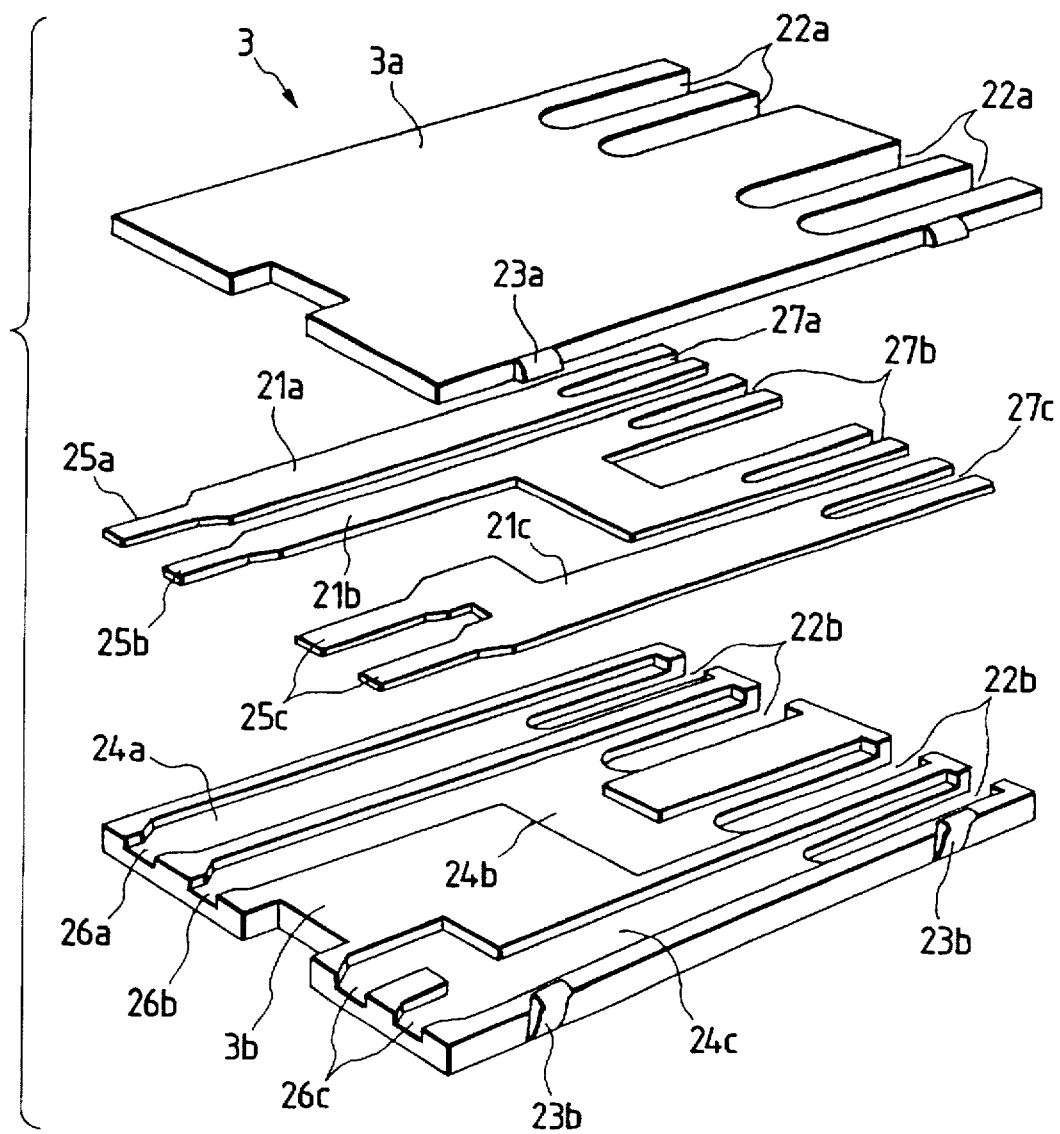
FIG. 4 is an exploded perspective view for a description of the structure of the bus bar card shown in FIG. 3.

As shown in FIG. 4, the bus bar card 3 is in the form of a flat plate, accommodating three bus bars 21a, 21b and 21c which are formed by punching a metal plate. More specifically, the bus bar card 3 is designed as follows. The bus bars 21a, 21b, and 21c are held between a pair of upper and lower cases 3a and 3b which are formed by molding synthetic resin.

The upper case 3a is in the form of a plate, and has four cut portions 22a in the rear end portion (in the right end portion in FIG. 4), and locking pieces 23a on both opposite edges which are locked to the lower case 3b (described later).

The lower case 3b is also in the form of a plate. In the surface of the lower case 3b, are formed engaging grooves 24a, 24b, and 24c which are similar in configuration to the bus bars 21a, 21b, and 21c, respectively. The engaging grooves 24a, 24b and 24c have lead-out openings 26a, 26b and 26c at first ends (at the left ends in FIG. 4) through which the terminals 25a, 25b and 25c of the bus bars 21a, 21b and 21c are led out, respectively.

Furthermore, the lower case 3b has cut portions 22b in the rear end portion (in the right end portion in FIG. 4), and locking pieces 23b on both opposite edges which are to be locked to the upper case 3a.

The bus bars 21a, 21b and 21c have terminals 25a, 25b and 25c which are protruded from the bus bar card 3, thus serving as connecting portions for the mating connector, and cut-shaped connecting portions 27a, 27b and 27c which are to be connected to the PCBs 5a and 5b, and the bus bar 4. In the embodiment, the bus bar 21a is linear, having the terminal 25a at one end, and the connecting portions 27a at the other end, the bus bar 21b has the terminal 25b at one end, and the two connecting portions 27b at the other end, and the bus bar 21c has the two terminals 25c at one end, and the connecting portion 27c at the other end.

The bus bar card 3 is assembled as follows. First, the bus bars 21a, 21b and 21c are fitted in the engaging grooves 24a, 24b and 24c of the lower case 3b. Under this condition, the lower case 3b having the bus bars 21a, 21b and 21c is covered with the upper case 3a with the locking pieces 23a and 23b locked to each other. As a result, as shown in FIG. 2, the terminals 25a through 25c appear protruded from the upper and lower cases 3a and 3b. Hence, when the bus bar casing 3 is engaged with the inserting holes 18, as shown in FIG. 1 the terminals 25a through 25c are extended in the recess 12 of the housing 11, so as to be connected to the mating connector.

Figure 3:
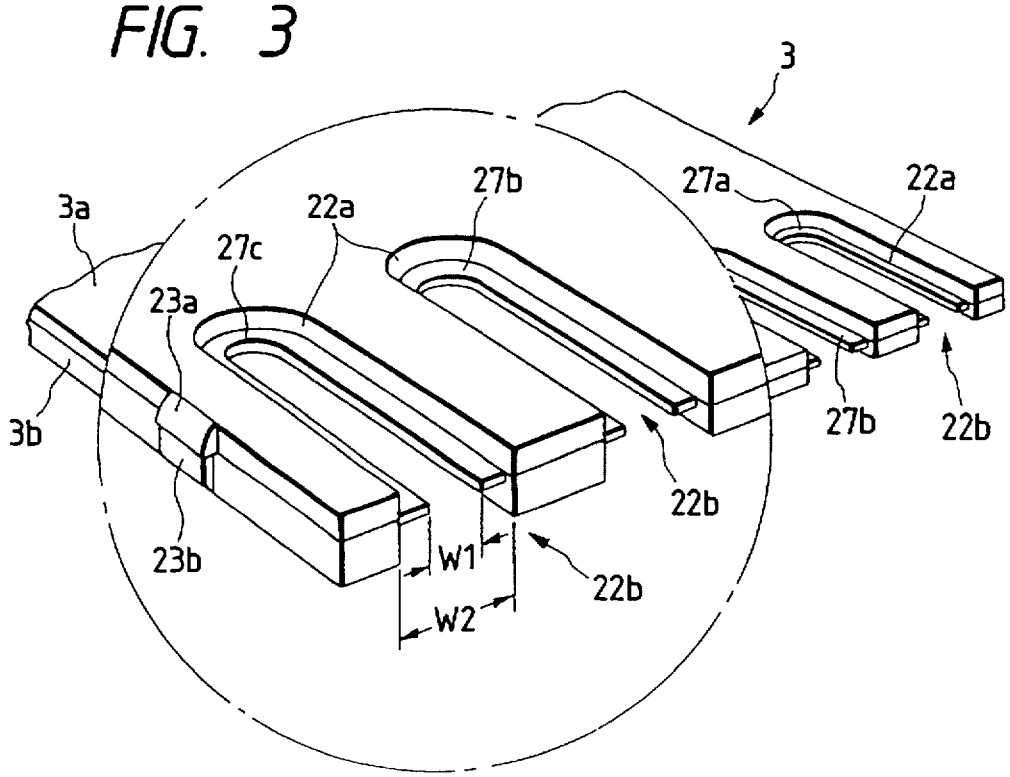
FIG. 3 is a perspective view on an enlarged scale showing essential parts of a bus bar card in the PCB multi-pole connector shown in FIG. 1.

The structure of the rear end portion of the bus bar card 3 will be described with reference to FIG. 3.

Figure 5:
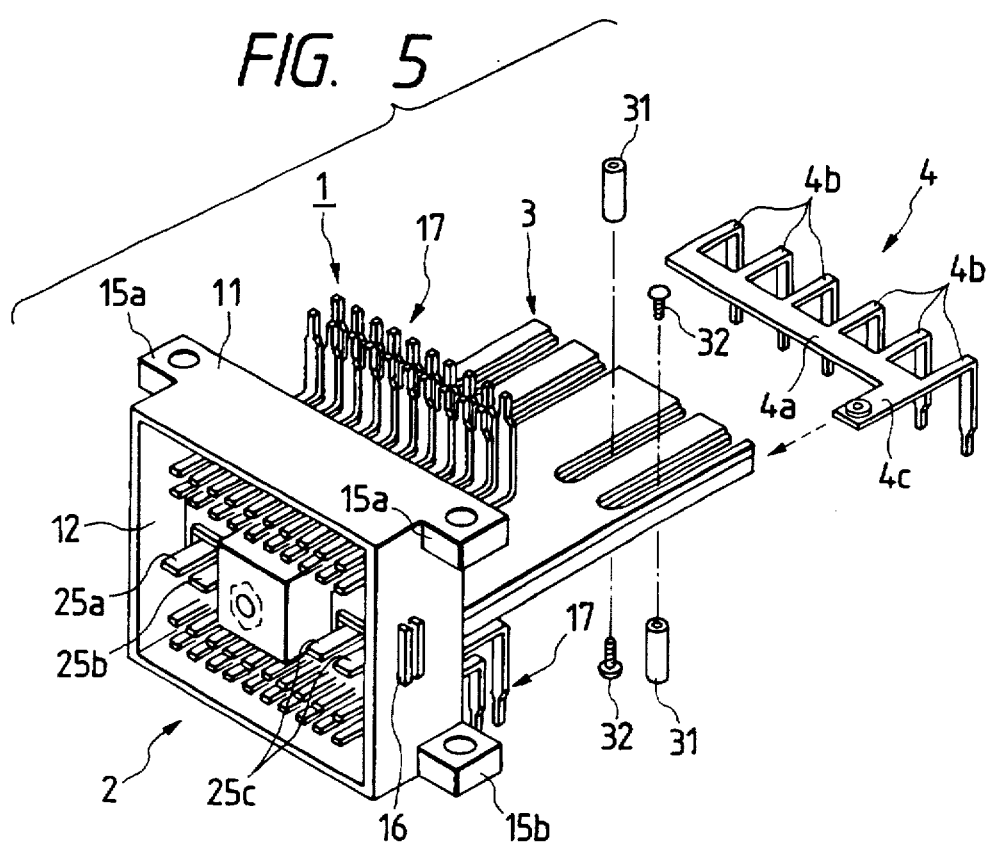
FIG. 5 is a perspective view for a description of the assembling of the bus bar card and a bus bar in the PCB multi-pole connector shown in FIG. 1.

The cut width WI of each of the cut-shaped connecting portions 27a, 27b and 27c are smaller than the width W2 of the cuts 22a and 22b of the upper and lower cases 3a and 3b. Hence, when the bus bar card 3 has been assembled, the electrically conductive connecting portions 27a, 27b and 27c are extended from the cut portions 22a and 22b as shown in FIG. 3. Through the connecting portions 27a, 27b and 27c thus extended, electrical connection of the bus bar 4 and the PCBs 5a and 5b is achieved. As shown in FIG. 5, the bus bar 4 is formed by punching a metal plate or the like, including a coupling portion 4a, a plurality of terminal portions 4b extended from the coupling portions 4a, and a connecting portion 4c which is electrically connected to the bus bars 21a in the bus bar card 3. In the embodiment, the connecting portion 4c of the bus bar 4 is connected to the bus bar 21c, however, the invention is not limited thereto or thereby.

The assembling work of the connector 1 will be described.

First as indicated by the arrow A in FIG. 2, the bus bar card 3 is inserted into the inserting holes 18 of the connector body 2 from behind. As a result, the connector body 2 is made integral with the bus bar card 3, and the terminals 25a through 25c of the bus bar card 3 are extended through the inserting holes 18 into the recess 12 of the connector body 2, so as to be engaged with the mating connector.

Next, the connection of the bus bars 21a through 21c to the PCBs 5a and 5b, and then to the bus bar 4 is carried out. First, the connection of the bus bars 21a through 21c to the PCBs 5a and 5b will be described.

As shown in FIG. 5, in electrically connecting the bus bar card 3 to the PCBs 5a and 5b, tubular studs 31 and screws 32 are used. Each of the tubular studs 31 are made of electrically conductive metal material, and has threaded holes at both ends. The diameter of each of the studs 31 is smaller than the width W2 (cf FIG. 3) of the cut portions 22a and 22b, but larger than the cut width W1 of the bus bars 21a through 21c.

Hence, when the end portions of the studs 31 are fitted in the cut portions 22a and 22b, they will not slip through them because the diameter of the studs 31 is larger than the cut width W1, that is, they are able to slide along the cut portions 22a and 22b. After being set at desired positions in the cut portions 22a and 22b, the studs are tightened with the screws 32, so that the studs 31 are electrically connected to the connecting portions 27a through 27c of the bus bars 21a through 21c.

In electrically connecting the bus bar card 3 to the PCBs 5a and 5b, the studs 31 are positioned on the upper and lower surfaces of the bus bar card 3, and tightened with the screws 31. As a result, the stud 31 is electrically connected to the lower surface of the connecting portion 27b of the bus bar 21b, and the stud 31 is electrically connected to the upper surface of the connecting portion 27c of the bus bar 21c. The positioning of the studs 31 is determined according to circuit patterns formed on the PCBs 5a and 5b.

Figure 6:
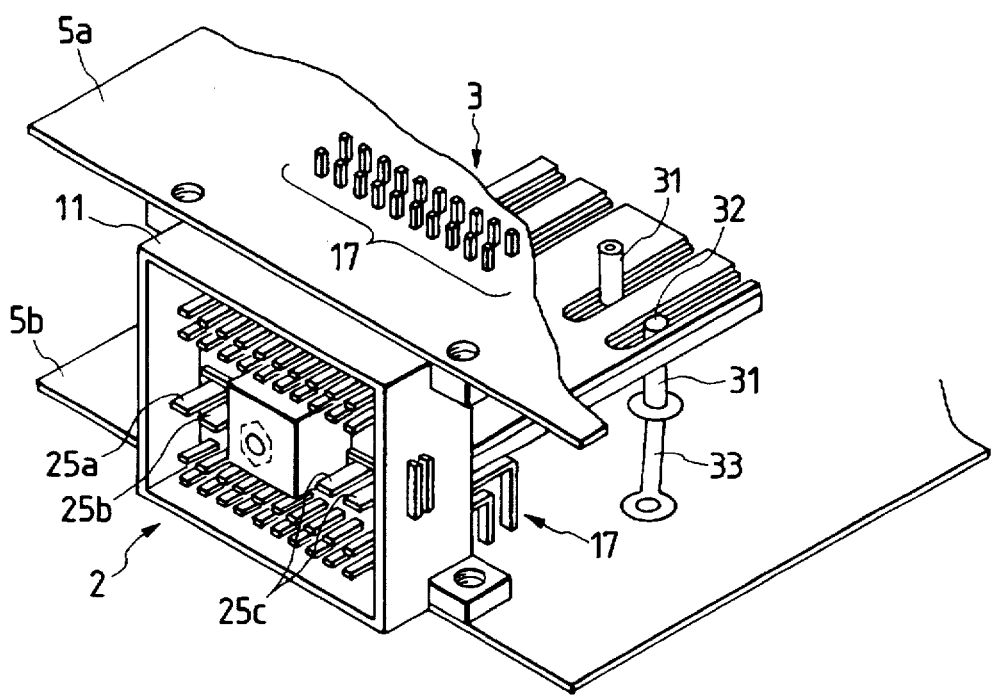
FIG. 6 is a perspective view for a description of the connection of the bus bar card in the PCB multi-pole connector shown in FIG. 1.

Next, the PCBs 5a and 5b are secured to the connector body 2 as shown in FIG. 6. In this case, the connecting terminals 17 secured to the connector body 2 are inserted into through-holes formed in the PCBs 5a and 5b, and then connected to the circuit patterns (not shown) for instance by soldering. The PCBs 5a and 5b are fixedly secured to the fixing members 15a and 15b of the connector body 2 with screws.

By way of example, connection of the PCB 5b will be described with reference to FIG. 6. The stud 31 is arranged between the lower surface of the bus bar card 3, i.e., the connecting portion 27c and the circuit pattern 33 formed on the PCB 5b. Under this condition, the screw is engaged with the stud from below the PCB 5b so that the latter 5bis secured to the stud 31, that is, the lower end of the stud 31 is brought into close contact with the circuit pattern 33. Thus, the bus bar 21 in the bus bar card 3 has been electrically connected to the circuit pattern 33 formed on the PCB 5b.

When the bus bar card 3 is coupled to the connector body 2, the terminals 25c of the bus bar 21c in the bus bar card 3 are extended in the connector body 2. Hence, when, in the case where the connector 1 is formed as shown in FIG. 6, the connector body 2 is engaged with the mating connector, the circuit pattern is electrically connected through the bus bar card 3 to the mating connector.

In the case of the circuit pattern (not shown) formed on the PCB 5a , too, the circuit pattern is electrically connected to the mating connector through the stud 31 fixed on the upper surface of the bus bar card 3.

The connection of the bus bar 4 will be described. As shown in FIGS. 1 through 5, the terminal portions 4b are connected to the circuit pattern 34 of the PCB 5b, and the connecting portion 4c is connected to the connecting portion 27c of the bus bar 21c. This connection may be achieved as follows. A threaded hole is formed in the connecting portion 27, or a nut is secured to the connecting portion 27, and a screw 32 is used to achieve the connection of the bus bar 4.

With the bus bar 4 connected in the above-described manner, the terminals 25c of the bus bar card 3 are electrically connected to the circuit patterns 33 and 34. Thus, without use of jumper wires, a large current circuit can be formed independently of the connecting terminals 17 of the connector body 2. This will eliminate the difficulty that a circuit large in current capacity is collectively wired to the connecting terminals 17. In addition, in designing circuit patterns, power distribution can be made at most suitable positions. Those effects should be highly appreciated.

As shown in FIGS. 1 and 6, the studs 31 may be coupled to the bus bar card 3 in such a manner that they are extended towards the PCB 5a. And since the connecting portions 27a, 27b, and 27c are extended, the following connection may be achieved. For instance, the stud 33 may be set between the screws 32 shown in FIG. 1 in such a manner that it is extended towards the PCB 5a. In this case, the circuit pattern of the PCB 5a is electrically connected to the circuit patterns 33 and 34 of the PCB 5b. This means that a variety of electrical circuits can be formed.

The above description may be substantially equally applied to the connection of the connecting portions 27a or 27b, which markedly increases the degree of freedom in designing circuits or circuit patterns.

The bus case card is detachably coupled to the connector body. In the case where it is unnecessary to use a large current circuit, the bus case card may not be coupled to the connector body. In this case, the connector body 2 may be used as an ordinary connector body, which increases the interchangeability of the connector body.

As was described above, in the PCB multi-pole connector of the invention, the bus bar card accommodating the bus bars is detachably engaged with the connector body, and upon engagement of the bus bar card with the connector body, connecting circuits are formed between the mating connector engaged with the connector body and the circuit formed on any one of the printed circuits, and between circuit patterns formed on the printed circuit boards.

Hence, when necessary the bus bar card can be engaged with the connector. In this case, the mating connector is connected to the first ends of the bus bars built in the bus bar card, while the connecting portions of the bus bars which are exposed in the cuts formed in the bus bar card are connected to the circuit patterns formed on the PCBs, whereby a circuit for a large current can be formed independently of the connecting terminals held by the connector body. That is, through the bus bars in the bus bar card, the circuit patterns can be connected which are formed spaced because of the design condition.

This feature eliminates the difficulty that the wiring of circuit patterns is made collectively to the connecting terminals held by the connector body, and markedly increases the degree of freedom not only in designing electronic devices using PCBs but also in designing circuit patterns.

The bus bar card is engaged with the connector body when necessary; that is, the connector body may be used without the bus bar card as the case may be. Hence, the PCB multi-pole connector of the invention is high in interchangeability.

In addition, the bus bars in the bus bar card may be freely changed, which increases the degree of freedom in designing circuits as much.

What is claimed is:

1. A PCB multi-pole connector, comprising:
    a connector body;
    a plurality of terminals mounted in said connector body, said terminals having first end portions for mating with terminals of a mating connector and second end portions for connecting with circuit patterns formed on printed circuit boards; and
    a bus bar card accommodating a bus bar, said bus bar having a terminal portion and a connecting portion,
    wherein said bus bar card is detachably mounted in said connector body to juxtapose said terminal portion with said first end portions of said terminals, said bus bar card includes upper and lower cases which have cut portions where said connecting portion of said bus bar is longitudinally exposed.

2. The PCB multi-pole connector of claim 1, wherein a circuit pattern for a large current which is formed in at least one of said printed circuit boards is electrically connected to said bus bar.

3. The PCB multi-pole connector of claim 1, wherein said printed circuit boards are secured to side surfaces of said connector body so that said printed circuit boards are confronted with each other, and said bus bar card is detachably set between said printed circuit boards.

4. The PCB multi-pole connector of claim 1 wherein said bus bar card includes upper and lower cases which have cut portions, and said connecting portion of said bus bar has a cut portion.

5. The PCB multi-pole connector of claim 4, wherein an edge portion of said cut portion of said connecting portion is exposed from said cut portions of bus bar card.

6. The PCB multi-pole connector of claim 4, wherein a cut width of said cut portion of said connecting portion is smaller than a width of said cut portions of said upper and lower cases.

7. The PCB multi-pole connector of claim 4, wherein said cut portion of said connecting portion is formed in a U-shape.

8. The PCB multi-pole connector of claim 4, wherein said cut portions of said upper and lower cases are formed in a U-shape.

9. The PCB multi-pole connector of claim 4, wherein said connecting portion of said bus bar is electrically connected to at least one of said circuit patterns of said printed circuit boards with an auxiliary member.

10. The PCB multi-pole connector of claim 4, wherein said upper and lower cases of said bus bar card is made of synthetic resin.

11. The PCB multi-pole connector of claim 1, wherein said terminals are formed in a L-shape.

12. A PCB multi-pole connector, comprising;
    a connector body to which printed circuit boards are fixedly secured;
    a plurality of terminals, for forming connecting circuits between said terminals and circuit patterns formed on said printed circuit boards, mounted in said connector body; and
    a bus bar card accommodating bus bars, said bus bar card detachably engaged with said connector body,
    wherein, upon engagement of said bus bar card with said connector body, connecting circuits are formed between a mating connector engaged with said connector body and circuit patterns formed on at least one of said printed circuit boards, and between circuit patterns formed on said printed circuit boards.

13. A PCB multi-pole connector as claimed in claim 12, in which said bus bar card includes upper and lower cases which have cut portions where first end portions of said bus bars are longitudinally exposed.

14. A PCB multi-pole connector as claimed in claim 12, in which a circuit pattern for a large current which is formed in at least one of said printed circuit boards is electrically connected to at least one of said bus bars accommodated in said bus bar card.

15. A PCB multi-pole connector as claimed in claim 12, in which said printed circuit boards are secured to both side surfaces of said connector body in such a manner that said printed circuit boards are confronted with each other, and said bus bar card is detachably set between said printed circuit boards.

* * * * *